United States Patent [19]

Adams et al.

[11] Patent Number: 4,686,764
[45] Date of Patent: Aug. 18, 1987

[54] MEMBRANE PROTECTED PRESSURE SENSOR

[75] Inventors: Victor J. Adams, Tempe, Ariz.; Carl E. Derrington, East Greenbush, N.Y.

[73] Assignee: Motorola, Inc., Schaumburg, Ill.

[21] Appl. No.: 855,012

[22] Filed: Apr. 22, 1986

[51] Int. Cl.[4] .......................... G01L 7/08; G01L 9/00
[52] U.S. Cl. ........................................ 29/592; 73/706; 73/723; 73/754; 156/303.1; 264/272.17
[58] Field of Search ............... 73/706, 708, 727, 720, 73/721, 726, 754, DIG. 2; 29/454, 610 SG, 592 R, 157 R, 450, 25.35, 595; 128/675; 156/303.1; 264/272.16, 272.17

[56] References Cited

U.S. PATENT DOCUMENTS 2,569,987 10/1951 Frondel ................................ 73/727
4,274,423 6/1981 Mizuno et al. ....................... 73/726

FOREIGN PATENT DOCUMENTS 0153684 12/1979 Japan ................................... 73/727
0122125 9/1980 Japan ................................... 73/727

Primary Examiner—Donald O. Woodiel
Attorney, Agent, or Firm—Robert M. Handy

[57] ABSTRACT

A solid state semiconductor pressure sensor is described in which the pressure sensor element is protected from the ambient whose pressure is being measured by a combination of a pressure transfer medium and a thin covering membrane. A method is described for applying the thin covering membrane so as to substantially avoid entrapment of air or formation of voids in the pressure transfer medium which would degrade the performance of the sensor. The pressure transfer medium is a gel-like material such as a silastic. The membrane is chosen to be substantially impermeable to the ambients being measured and sufficiently flexible to be rolled across the surface of the assembly during fabrication and to avoid attenuation of the input pressure signal. Fluorosilicone is an example of a suitable membrane material.

13 Claims, 9 Drawing Figures

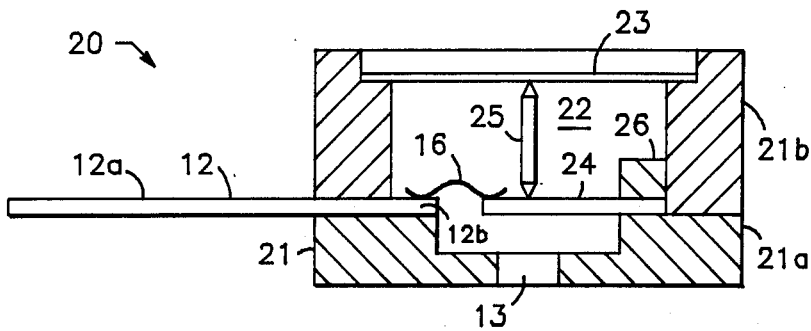
FIG. 3 — PRIOR ART —
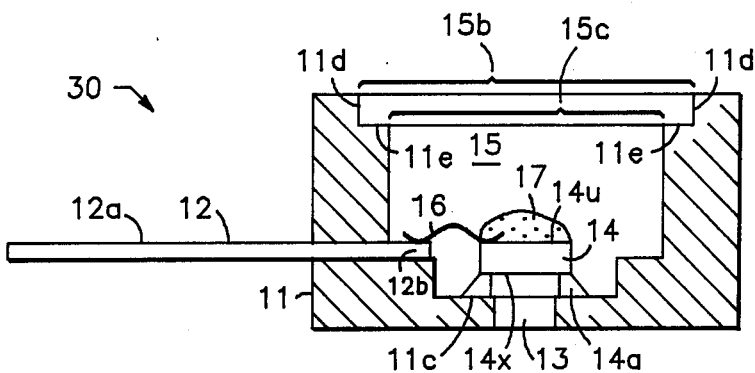
FIG. 4A
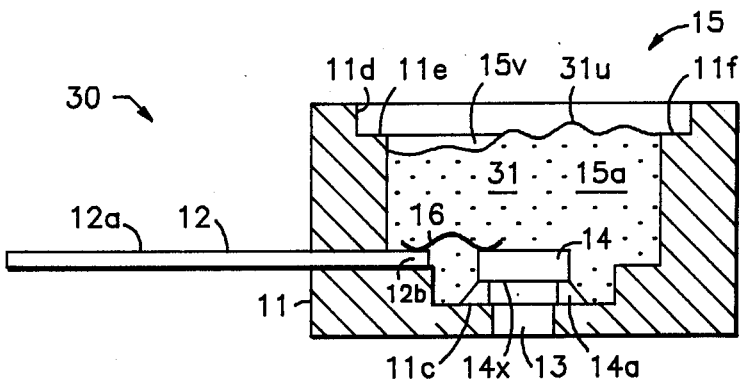
FIG. 4B

4,686,764

MEMBRANE PROTECTED PRESSURE SENSOR

BACKGROUND OF THE INVENTION

1. Field of the Invention

This invention relates in general to solid state pressure sensors and, more particularly, to means and methods for protecting a semiconductor pressure sensor element from the atmosphere whose pressure is being sensed.

2. Background Art

Solid state pressure sensors are being employed in a variety of new applications because of their small size and compatibility with other electronic systems. Semiconductor chips or die are generally used as the pressure sensing elements. However, such semiconductor sensing elements are particularly sensitive to contamination. Thus, if the surface of the semiconductor sensing element is exposed directly to the ambient whose pressure is being measured, the semiconductor sensing element may be adversely effected.

A number of different approaches have been used in the prior art in order to separate the semiconductor sensing element from the ambient being measured. Among these are, for example, the use of die coats and the use of metal diaphragms coupled to the semiconductor sensing element by rigid bars or levers. None of these approaches has proved entirely satisfactory. Accordingly, a need continues to exist for improved means and methods for protecting semiconductor pressure sensing elements from the ambient whose pressure is being measured.

Accordingly, it is an object of the present invention to provide an improved means and method for protecting a semiconductor pressure sensing element from the ambient whose pressure is being measured.

It is a further object of the present invention to provide an improved means and method whereby the semiconductor sensing element is protected from the ambient without substantial loss in sensitivity.

It is an additional object of the present invention to provide an improved means and method for protecting a semiconductor pressure sensing element from the ambient without the use of metal diaphragms with rods or levers.

It is a further object of the present invention to provide an improved means and method for protecting a semiconductor pressure sensing element which is of light weight and extremely shock resistant.

SUMMARY OF THE INVENTION

The attainment of the foregoing and other objects and advantages is achieved through the present invention wherein there is provided a dielectric body; a cavity in the dielectric body having a first surface for receiving a pressure sensing element and a second surface for contacting a diaphragm means; a pressure sensing element mounted on the first surface with its pressure sensing region facing into the cavity; electrical lead means in the body for providing electrical connections to the sensing element; diaphragm means sealed to the second surface to prevent materials from the environment from reaching the sensor element; and a non-gaseous pressure transfer medium in contact with the pressure sensing region of the sensing element and the diaphragm means, and filling the space of the cavity between the pressure sensing element and the diaphragm means substantially without voids. The pressure transfer medium may be a liquid or a gel-like material or elastic solid. The pressure transfer medium should have a resiliency when cured, as measured with a Universal Penetrometer using a 19.5 gm shaft and a 6.35 mm diameter foot, of at least 2-8 mm penetration or larger. The diaphragm means must be flexible in order to respond to variations in external pressure and transfer the external pressure through the pressure transfer medium to the sensing element.

The attainment of the foregoing and other objects and advantages is further achieved through a method for forming a sealed pressure sensor, comprising: providing a body having a recess therein for receiving a pressure sensor element on a first surface of the recess, wherein the recess has an opening surrounded by a annular-shaped lip spaced from the first surface; mounting the pressure sensing element on the first surface; filling the recess with a gel-like pressure transfer medium which is in contact with an edge of the lip in at least a first location; placing a first edge of a flexible diaphragm in contact with the lip and the pressure transfer medium at the first location; rolling the flexible diaphragm onto the remainder of the lip and the pressure transfer medium beginning at the first location and progressing across the opening and the transfer medium in a direction away from the first location; during the rolling step, using the diaphragm to squeeze a part of the pressure transfer medium into the recess ahead of the diaphragm to displace any gas remaining within the recess in places not already occupied by the pressure transfer medium and force such gas out from between the diaphragm and the lip until the recess is filled substantially void free with the pressure transfer medium; and sealing the diaphragm to the lip.

The details of the present invention will be more completely understood in terms of the drawings and description which follow.

BRIEF DESCRIPTION OF THE DRAWINGS

FIG. 3 shows in simplified schematic form a cross-section through a semiconductor solid state pressure sensor employing a diaphragm, according to the prior art;

FIGS. 4A-D show in simplified schematic form cross-sections through a solid state semiconductor pressure sensor at different stages of fabrication, according to the present invention.

DETAILED DESCRIPTION OF THE DRAWINGS

For purposes of explanation, the pressure sensor assemblies and structures described herein are illustrated for a semiconductor solid state sensing element. However, those of skill in the art will understand that other solid state sensing elements having a region for sensing a pressure to be measured on a first surface and a region for sensing a reference pressure on a second surface, opposite the first surface may equally well be used.

Figure 1:
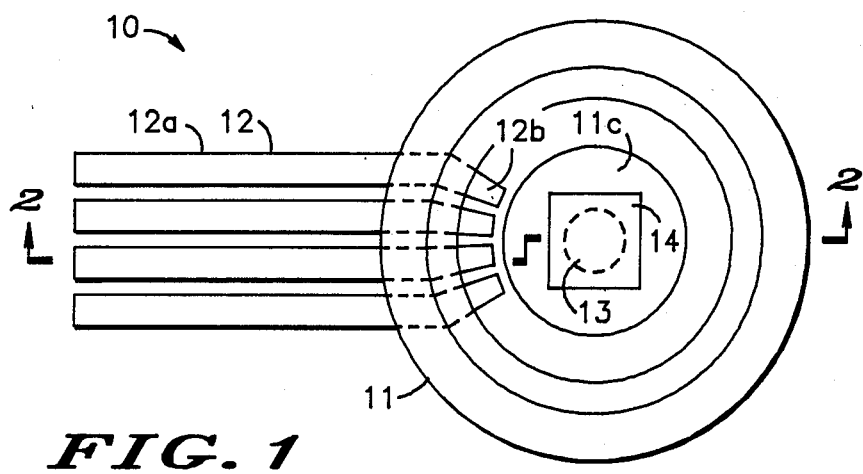
FIG. 1 shows in simplified schematic form a top view of a typical solid state semiconductor pressure sensor with the lid removed.
Figure 2A:
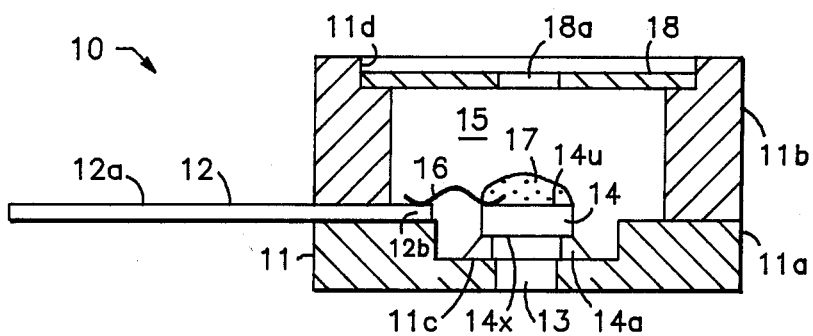
FIG. 2A shows a cross-section in simplified schematic form through the pressure sensor of FIG. 1 with a lid included.
Figure 2B:
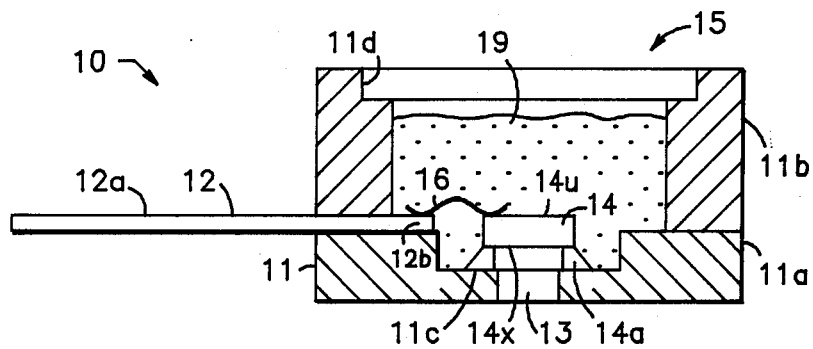
FIG. 2B shows a cross-section similar to that of FIG. 2A but according to a different embodiment and without a lid.

FIG. 1 shows in simplified schematic form a top view of a solid state pressure sensor. FIGS. 2A-B show cross-sections of the sensor of FIG. 1. In FIGS. 1 and 2A-B, pressure sensor 10 comprises body 11 having internal cavity 15 in which is mounted solid state sensing element 14. Insulated leads 12 having exterior portions 12a and interior portions 12b are provided which extend through the wall of body 11 into cavity 15. Sensing element 14 is mounted on surface 11c in cavity 15 of body 11 by means 14a above hole 13. Reference pressure receiving portion 14x of sensing element 14 is aligned over hole 13. Sensing element 14 is connected to leads 12 by (typically) wirebonds 16. Body 11 may be conveniently formed of two separate parts 11a, 11b as indicated in FIGS. 2A-B. Alternatively, body 11 may be formed in a single unit as has been described for example, in copending application Ser. No. 784,980 by Victor J. Adams, entitled "Unibody Pressure Transducer Package", and commonly assigned. Body 11 is conveniently a dielectric material.

FIG. 2A illustrates the embodiment in which protective lid 18 containing hole 18a is inserted in notch 11d in body 11, and in which die coat 17 is applied over sensing element 14. While such an arrangement provides mechanical protection for sensing element 14, only die coat 17 prevents the ambient whose pressure is intended to be measured from reaching upper surface 14u of sensing element 14. It has been found, that materials which are suitable die coats for semiconductor sensing elements are frequently permeable to or adversely affected by a number of ambients (e.g., gasoline, hydrocarbon solvents, exhaust gases, etc.) whose pressure is desired to be measured. Accordingly, the sensor configuration illustrated in FIG. 2A is frequently subject to instability, drift, and degradation in such ambients. Further, the arrangement of FIG. 2A permits light to reach surface 14u of sensor 14, which may further disturb its operation.

Improved performance is obtained by replacing die coat 17 by opaque material 19 which is placed in cavity 15 surrounding sensing element 14, as illustrated in FIG. 2B. However, it has been found that materials which are sufficiently resilient to be used in region 19 without causing substantial loss in sensitivity through attenuation of the input pressure signal, are generally also permeable to or attacked by many ambients.

A method which avoids some of the above problems and which has been used in the prior art is illustrated in FIG. 3. FIG. 3 is a cross-section through solid state pressure sensing element 20 comprising body 21 having upper and lower parts 21a-b, leads 12 having external portions 12a and internal portions 12b, and bar shaped semiconductor sensing element 24 which is attached at one end to body 21 by clamp means 26 and connected to leads 12 via wirebonds 16. Metal diaphragm 23 separates cavity 22 containing sensing element 24 from the ambient whose pressure is intended to be measured. Hole 13 allows the reference pressure to be communicated to cavity 22. Rigid bar or rod 25 provides mechanical coupling between the center of diaphragm 23 and semiconductor sensing element 24.

While the configuration of FIG. 3 protects sensing element 24 from the ambient whose pressure is intended to be measured, the arrangement of FIG. 3 is expensive to manufacture because of the small piece parts which must be individually handled and precisely located within body 21 and is comparatively fragile. It is well known, for example, that semiconductor pressure sensing elements are extremely brittle. In order to have high sensitivity in the arrangement of FIG. 3, cantilever bar shaped element 24 must be directly coupled via rod 25 to diaphragm 23. Over-pressure conditions applied to diaphragm 23 can readily cause catastrophic failure of sensing element 24. A further disadvantage of the structure of FIG. 3 is that the sensitivity and calibration of the sensor depend critically upon the placement of bar 25 on sensing element 24 and diaphragm 23. A further problem with the arrangement of FIG. 3 is that the active regions of sensing element 24 are exposed to the reference ambient entering via hole 13.

These and other disadvantages may be overcome by the means and method of the present invention which are illustrated in FIGS. 4A-D and FIG. 5. FIGS. 4A-D and 5 are simplified schematic cross-sectional views of a solid state pressure sensor, similar to FIGS. 2A-B, but according to the present invention. FIGS. 4A-D and 5 illustrate the structure at different stages of fabrication.

As shown in FIG. 4A, solid state sensor 30 comprises body 11 having leads 12 with external portions 12a and internal portions 12b. Semiconductor sensing element 14 having reference pressure receiving region 14x is mounted by means 14a on surface 11c in cavity 15 of body 11 over hole 13. Wirebonds 16 are used for coupling the active regions of sensor 14 to leads 12. As shown in FIG. 4A, upper surface 14u of sensor element 14 may be covered with conventional die coat 17. However, this is not essential and die coat 17 may be omitted. Body 11 conveniently contains annular shelf 11e and notch portion 11d at the open end of cavity 15 containing sensing element 14. Sensing element 14 may be sealed to surface 11c by any convenient means 14a well known in the art. Organic adhesives are a suitable means. The reference pressure entering via hole 13 acts only on portion 14x of sensor 14 and does not enter cavity 15.

Once die 14 has been mounted in cavity 15 of body 11, then (see FIG. 4B) lower portion 15a of cavity 15 is filled with pressure transfer medium 31. It is important that during filling of lower portion 15a of cavity 15 with material 31 that trapped gas pockets or enclosed voids be avoided as much as possible. This is conveniently accomplished by using a material for pressure transfer medium 31 which is a liquid at the time of introduction. One or more measured droplets of the material are conveniently placed on die 14 from where they flow into and fill lower portion 15a of cavity 15. It is important that upper surface 31u of material 31 extend at least to the level of shelf 11e of body 11.

Medium 31 may be of any convenient material which does not contaminate sensor element 14 and which remains in liquid or at least gel-like or elastic form after introduction. If a material is used which sets up or becomes hard such as, for example, many epoxies, then the pressure signal which will subsequently be introduced via opening 15b in body 11 will be attenuated before reaching sensor element 14 and the finished device will be insensitive. Accordingly, it is desirable that material 13 have an elasticity of at least 2-8 mm penetration in the finished device, as measured using a Universal Penetrometer with a 19.5 gm shaft having a 6.35 mm diameter foot. More elastic materials (i.e., greater penetration), even liquids, can also be used. If the material is cured after being introduced into cavity 15, then the above-noted elasticities apply after curing. An example of a suitable material is Visilox type 191 silastic manufactured by the Visilox Company of Troy, N.Y.

Visilox 191 is a material which is initially in a liquid or semi-liquid state and upon curing sets up to the consistency of a very soft rubber-like material or gel. In order to make the material opaque to light, approximately 40 percent by volume of titanium dioxide is preferably mixed into the Visilox 191 material prior to its being introduced into cavity 15, but this is not essential. After being placed into portion 15a of cavity 15, the Visilox 191 material is conveniently vacuum cured following the manufacturer's recommendations. Approximately 30 minutes at about 150° C. is suitable. Those of skill in the art will understand that other curing cycles can also be used. The Visilox 191 shrinks slightly on curing, so the filling of portion 15a of cavity 15 should provide initially a slight excess material. A more convenient method however is to provide an initial fill of material 31 approximately to the level of shelf 11e, cure the initial fill, as described above, and then prior to applying membrane 32 (FIG. 4C) add a small amount of the uncured form of material 31 or other liquid to bring the level back up to or slightly above the level of shelf 11e.

Figure 4C:
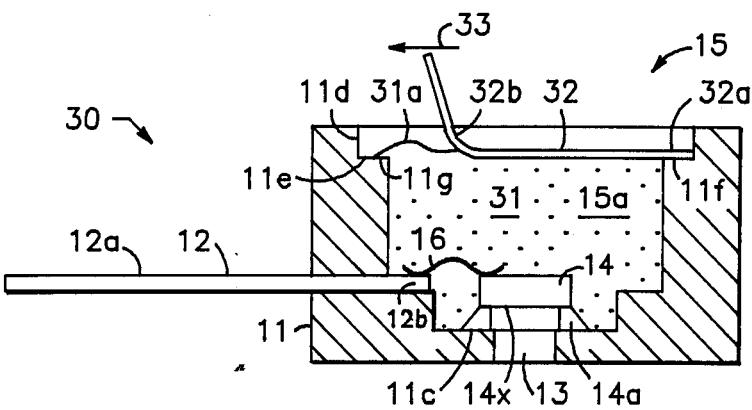

It is important that upper surface 31u of pressure transfer medium 31 be in contact with the edge of shelf 11e in at least one location such as for example at location 11f (see FIGS. 4B–C). It is desired to cover pressure transfer medium 31 with membrane 32 so as to obtain the structure shown in FIGS. 4D and 5. Membrane 32 must be flexible and substantially impermeable to the ambients of interest.

It is important that membrane or diaphragm 32 be applied to pressure transfer material 31 in such a way that substantially no air pockets or other voids are trapped within medium 31. If significant voids or pockets are present, the sensitivity and linearity of the pressure transducer will be adversely affected. Substantially void-free application of membrane 32 may be conveniently accomplished by the method illustrated in FIG. 4C, in which first portion 32a of membrane 32 is placed in contact with location 11f of shelf 11e where pressure transfer medium 31 meets shelf 11e. Membrane 32 is then rolled across opening 15c away from starting location 11f and portion 32a in the direction indicated by arrow 33. In the process of rolling out diaphragm 32, curved portion 32b of diaphragm 32 pushes ahead of it bow-wave 31a of material 31 which fills in any exposed empty places or voids within cavity portion 15a, e.g., such as are illustrated at location 15v in FIG. 4B. The rolling and squeezing motion of diaphragm 32, as indicated by arrow 33 in FIG. 4C, is continued until all the voids or empty places within cavity portion 15a have been filled by pressure transfer medium 31 and membrane 32 reaches location 11g of body 11 approximately opposite starting location 11f (see FIG. 4D). Any excess amount 31e of material 31 which was provided in the filling operation is squeezed out from under membrane 32 as it is rolled out flat against shelf 11e at location 11g.

Excess material 31e may be removed, or, optionally, left in place to serve as an adhesive for retaining means or ring 40 (see FIG. 5) which is inserted in notch 11d of body 11 in order to retain membrane 32 in place. Since body cavity portion 15a is substantially filled with material 31 in its cured state, with only a small surface skim of uncured material, the device illustrated in FIG. 5 may be used as is. However, an additional brief curing cycle in the temperature range 100°–200° C. may also be used to set up any remaining uncured portion of pressure transfer medium 31.

The presence of membrane 32 has been found to be essential to prevent some undesirable ambients from reaching sensor element 14. Materials such as Visilox 191, while having desirable properties as a pressure transfer medium are still sufficiently permeable to many ambients so as to provide insufficient protection. Membrane 32 may be made of any convenient flexible impermeable material. It is important that membrane 32 be flexible since if it is stiff, the pressure signal will be attenuated prior to reaching sensor element 14. Generally the membrane material should have a Shore A hardness less than about 70 and preferably in the range 30–70. Thickness for membrane 32 in the range 0.0004 to 0.010 inches (0.010 to 0.254 mm) are useful with 0.005 to 0.008 inches (0.127 to 0.203 mm) being preferred.

Fluorosilicone is an example of a suitable material for membrane 32. Pressure sensors were constructed wherein body 11 was circular and in which opening 15b had a diameter of approximately 11.18 mm, and opening 15c had a diameter of approximately 8.13 mm. A fluorosilicone diaphragm having an outer diameter corresponding approximately to the size of opening 15b was cut from 0.005 inch (0.127 mm) thick material and assembled over a Visilox 191 pressure transfer medium as described above. It was determined that the sensitivity of the resulting unit was substantially the same with and without membrane 32. The fluorosilicone used was type 60F01 material manufactured by the Moxness Products, Inc., of Racine, Wis. This fluorosilicone material is particularly soft and flexible. If a harder or denser membrane material is desired to be used, such as for example, a polyimide material, then the thickness of the membrane should be correspondingly reduced in order to maintain about the same sensitivity. For example, a polyimide membrane about equivalent to the above-described fluorosilicone membrane should have a thickness of approximately 0.002 inches (0.050 mm). Polysulfone materials are also suitable for membrane 32. It is desireable that the thickness of different membrane materials be adjusted approximately inversely proportional to their relative hardness.

It will be appreciated by those of skill in the art, that different membrane materials which are particularly impermeable to certain ambients may be used to cover sensors intended for such ambients.

Figure 4D:
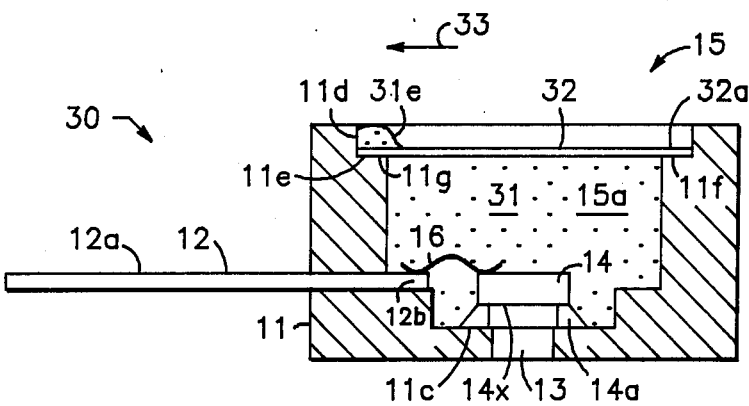
Figure 5:
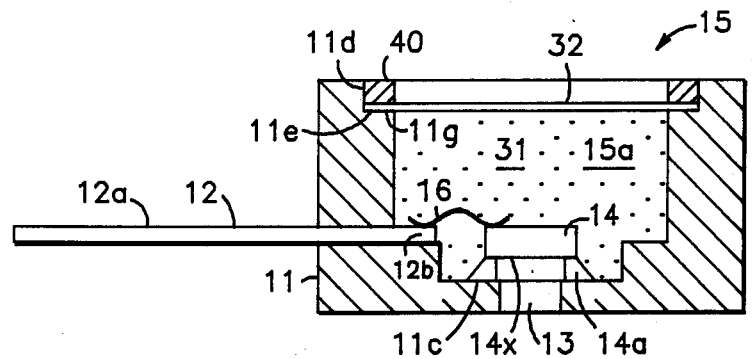
FIG. 5 shows a cross-sectional view similar to that in FIGS. 4A-D but after a further stage of fabrication.

It will also be appreciated by those of skill in the art, that the above-described structure and method of fabrication provide a particularly convenient membrane protected pressure sensor. No complex mechanical linkages, as were used for example in the structure of FIG. 3, are required. The finished device as illustrated in FIGS. 4D and/or 5 is particularly rugged and uses a minimum number of piece parts. Further, no complex mechanical assembly steps are required for coupling the membrane to the sensing element. Additionally, the device is not readily damaged by over-pressure conditions since the active portion of the semiconductor element is uniformly supported by attachment means 14a surrounding hole 13.

Those of skill in the art will understand that a variety of different sensing elements may be used in connection with the means and method of the present invention, and further that a wide variety of pressure transfer materials may be employed provided they are sufficiently liquid to be applied substantially void-free in filling cavity portion 15a, and sufficiently elastic after installation (and curing) to transmit the pressure applied to membrane 32 to sensor 14 without significant attenuation. Those of skill in the art will also understand that a wide variety of membrane materials may be used provided they are substantially impermeable to the ambient whose pressures are intended to be measured and sufficiently flexible to be applied by the methods described herein and to avoid attenuation of the pressure signal. Accordingly, it is intended to include all such variations in the claims which follow.

We claim:

1. A method for forming an environmentally protected pressure sensor, comprising:
   providing a dielectric body containing a cavity, wherein said cavity has a first surface for receiving a pressure sensor element and wherein said cavity has an opening communicating with said first surface and surrounded by a second surface;
   mounting said pressure sensor element on said first surface;
   filling said cavity around said pressure sensor element with a volume of a pressure transfer material exceeding the volume of said cavity around said sensor element up to said opening;
   providing a flexible diaphragm intended for sealing said opening;
   contacting a first portion of said diaphragm to a first portion of said second surface and an adjacent first portion of said pressure transfer material;
   without removing said first portion of said diaphragm, rolling a second portion of said diaphragm across said opening in contact with a second portion of said pressure transfer material and a second portion of said second surface; and
   squeezing any excess pressure transfer material out between a third portion of said diaphragm and a third portion of said second surface.

2. The method of claim 1 further comprising providing a retaining means for clamping said diaphragm to said second surface.

3. The method of claim 1 wherein said filling step comprises placing said pressure transfer material in said cavity so that at least some portion of said pressure transfer material extends beyond said opening.

4. The method of claim 1 wherein said step of providing a flexible diaphragm comprises providing a diaphragm formed from a polymeric material.

5. The method of claim 1 wherein said pressure transfer medium is a material having an elasticity after curing, as measured using a Universal Penetrometer with a 10.5 gm shaft and 6.35 mm foot, in the range 2–8 mm penetration or larger.

6. The method of claim 1 wherein said diaphragm is a flurorsilicone material.

7. A method for forming a sealed pressure sensor, comprising:
   providing a body having a recess therein for receiving a pressure sensor element on a first surface of said recess, wherein said recess has an opening surrounded by a first lip portion spaced from said first surface and a second surface extending from said lip portion to said first surface, and wherein said first surface, said second surface and said lip portion define said recess;
   mounting said pressure sensor element on said first surface;
   filling said recess to at least said lip portion with a non-gaseous pressure transfer medium which is in contact with said lip portion in at least a first location;
   placing a first edge of a flexible diaphragm in contact with said lip portion and said pressure transfer medium at said first location; and
   rolling said flexible diaphragm onto the remainder of said lip portion and the remainder of said pressure transfer medium, beginning at said first location and progressing across said lip portion and said transfer medium in a direction away from said first location while squeezing any of said pressure transfer medium extending beyond said lip portion substantially into any unfilled parts of said recess between said diaphragm and said first surface until said recess is filled.

8. The method of claim 7 further comprising after said rolling and squeezing steps, forcing any pressure transfer medium exceeding the amount required to fill said recess between said diaphragm and said first surface out at the edge of said diaphragm.

9. The method of claim 7 further comprising providing a retaining means at the edge of said diaphragm for retaining said diaphragm.

10. The method of claim 7 wherein said lip comprises an annular shaped surface surrounding the opening of said recess and wherein said body contains a notch portion extending to said annular shaped surface and wherein said diaphragm covers said annular shaped surface and further comprising providing a ring shaped retaining means in said notch portion above said annular surface for retaining said diaphragm.

11. A method for forming a membrane sealed pressure sensor, comprising:
   providing a body having a recess therein for receiving a pressure sensor element on a first surface of said recess, wherein said recess has an opening surrounded by an annular shaped lip spaced from said first surface and a second surface extending from said lip to said first surface;
   mounting said pressure sensor element on said first surface;
   filling said recess with a gel-like pressure transfer medium which is in contact with an edge of said lip in at least a first location;
   placing a first edge of a flexible diaphragm in contact with said lip and said pressure transfer medium at said first location;
   rolling said flexible diaphragm onto the remainder of said lip and pressure transfer medium beginning at said first location and progressing across said opening and said transfer medium in a direction away from said first location;
   during said rolling step, using said diaphragm to squeeze a part of said pressure transfer medium into said recess ahead of said diaphragm to substantially fill any voids remaining within said recess in places not already occupied by said pressure transfer medium and force any gas remaining in said voids out from between said diaphragm and said lip until said recess is filled with said pressure transfer medium; and
   sealing said diaphragm to said lip.

12. The method of claim 11 wherein said filling step comprises, introducing into said recess a first curable pressure transfer material, curing said first pressure transfer material, then adding a second pressure transfer material to fill said recess at least to said lip.

13. The method of claim 12 wherein said second pressure transfer material is also curable, further comprising after said rolling and squeezing steps, heating said sensor to cure said second pressure transfer material.

* * * * *

UNITED STATES PATENT AND TRADEMARK OFFICE
CERTIFICATE OF CORRECTION

PATENT NO. : 4,686,764

DATED : August 18, 1987

INVENTOR(S) : Victor J. Adams et al.

It is certified that error appears in the above-identified patent and that said Letters Patent is hereby corrected as shown below:

Claim 5, line 4, replace "10.5" by -- 19.5 --.

Signed and Sealed this

Twenty-third Day of February, 1988

Attest:

DONALD J. QUIGG

Attesting Officer        Commissioner of Patents and Trademarks